United States Patent
Abiru et al.

(10) Patent No.: US 9,930,283 B2
(45) Date of Patent: Mar. 27, 2018

(54) SOLID STATE IMAGE SENSOR AND ELECTRONIC APPARATUS

(71) Applicant: SONY CORPORATION, Tokyo (JP)

(72) Inventors: Takahiro Abiru, Fukuoka (JP); Yasuaki Hisamatsu, Fukuoka (JP); Tadafumi Nagata, Fukuoka (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/502,800

(22) PCT Filed: Aug. 6, 2015

(86) PCT No.: PCT/JP2015/072322
§ 371 (c)(1),
(2) Date: Feb. 9, 2017

(87) PCT Pub. No.: WO2016/027683
PCT Pub. Date: Feb. 25, 2016

(65) Prior Publication Data
US 2017/0230599 A1  Aug. 10, 2017

(30) Foreign Application Priority Data
Aug. 19, 2014  (JP) .................................. 2014-166562

(51) Int. Cl.
*H03M 1/56*  (2006.01)
*H04N 5/378*  (2011.01)
(Continued)

(52) U.S. Cl.
CPC .............. *H04N 5/378* (2013.01); *H03M 1/56* (2013.01); *H03M 1/66* (2013.01); *H03M 1/82* (2013.01)

(58) Field of Classification Search
CPC .......... H04N 5/378; H03M 1/56; H03M 1/66; H03M 1/82
(Continued)

(56) References Cited

U.S. PATENT DOCUMENTS 7,554,066 B2 * 6/2009 Yan ........................ H04N 5/378
250/208.1
8,760,213 B2 * 6/2014 Saito .................... H03K 3/0231
327/406

(Continued)

FOREIGN PATENT DOCUMENTS

JP      2007-059991       3/2007
JP      2010-258736 A    11/2010
(Continued)

OTHER PUBLICATIONS

International Search Report prepared by the Japan Patent Office dated Oct. 1, 2015, for International Application No. PCT/JP2015/072322.

*Primary Examiner* — Khai M Nguyen
(74) *Attorney, Agent, or Firm* — Sheridan Ross P.C.

(57) ABSTRACT

The present disclosure relates to a solid state image sensor and an electronic apparatus capable of performing a gain transition at high speed. A ramp generation circuit includes sample hold circuits and ramp generation DACs, the number of which depends on kinds of required gains (for example, two kinds, i.e. a low gain and a high gain). Then, the two sample hold circuits can individually hold gain DAC output voltages at the different gains. This enables a switch to the ramp generation DAC holding the required gain voltage by means of a ramp selection signal. The present disclosure can be applied, for example, to a CMOS solid state image sensor that is used for an imaging device.

10 Claims, 16 Drawing Sheets

(51) Int. Cl.
*H03M 1/82* (2006.01)
*H03M 1/66* (2006.01)

(58) Field of Classification Search
USPC ...... 341/155, 158, 169; 250/208.1; 348/294, 348/302, 308
See application file for complete search history.

(56) References Cited

U.S. PATENT DOCUMENTS 8,941,528 B2 * 1/2015 Yun .................... H04N 5/37455
341/155
9,019,409 B2 * 4/2015 Kim .................... H04N 5/3575
341/155

FOREIGN PATENT DOCUMENTS

| JP | 2010-288218 A | 12/2010 |
| JP | 2013-229853 A | 11/2013 |
| JP | 2014-120860 A | 6/2014 |

\* cited by examiner

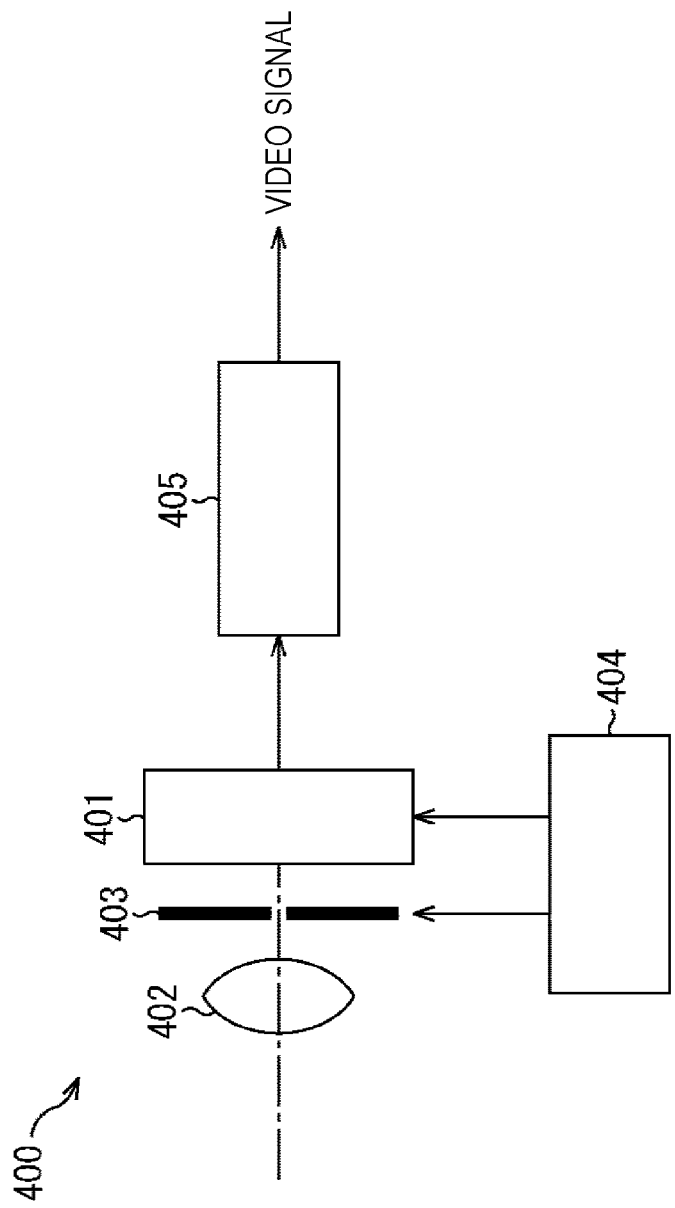

SOLID STATE IMAGE SENSOR AND ELECTRONIC APPARATUS

CROSS REFERENCE TO RELATED APPLICATIONS

This application is a national stage application under 35 U.S.C. 371 and claims the benefit of PCT Application No. PCT/JP2015/072322 having an international filing date of 6 Aug. 2015, which designated the United States, which PCT application claimed the benefit of Japanese Patent Application No. 2014-166562 filed 19 Aug. 2014, the disclosures of which are incorporated herein by reference in their entirety.

TECHNICAL FIELD

The present disclosure relates to a solid state image sensor and an electronic apparatus, and in particular relates to the solid state image sensor and the electronic apparatus capable of performing a gain transition at high speed.

BACKGROUND ART

There is a DAC circuit which generates a ramp wave that is used for ramp voltage comparative A/D conversion. In a circuit having a gain control DAC that controls an output gain of the ramp wave in the DAC circuit, a gain value is frequently switched in some cases (refer to Patent Document 1).

CITATION LIST

Patent Document

Patent Document 1: Japanese Patent Application Laid-Open No. 2007-59991

SUMMARY OF THE INVENTION

Problems to be Solved by the Invention

In such a case, settling time for output of the gain control DAC after the switch of the gain sometimes compresses read time for the A/D conversion.

The present disclosure has been made in consideration of the above-mentioned circumstances, and can perform a gain transition at high speed.

Solutions to Problems

A solid state image sensor according to an aspect of the present technology includes: a ramp generation digital-to-analog converter (DAC) configured to generate a ramp wave, the number of ramp generation DACs corresponding to different kinds of gains; and a sample hold circuit configured to individually hold each of gain DAC output voltages corresponding to the different kinds of gains from a gain control DAC that controls an output gain of the ramp wave, the number of sample hold circuits corresponding to the different kinds of gains.

The one gain control DAC can further be included.

The ramp generation DAC is switched by an input ramp selection signal.

A DAC having a different function than the ramp generation DAC and the gain control DAC can further be included.

The DAC having the different function is a clamp DAC that adds an offset to the ramp wave.

An electronic apparatus according to an aspect of the present technology includes: a solid state image sensor including: a ramp generation digital-to-analog converter (DAC) configured to generate a ramp wave, the number of ramp generation DACs corresponding to different kinds of gains; and a sample hold circuit configured to individually hold each of gain DAC output voltages corresponding to the different kinds of gains from a gain control DAC that controls an output gain of the ramp wave, the number of sample hold circuits corresponding to the different kinds of gains; a signal processing circuit configured to process an output signal output from the solid state image sensor; and an optical system configured to cause incident light to enter the solid state image sensor.

The solid state image sensor can further include the one gain control DAC.

The ramp generation DAC is switched by an input ramp selection signal.

The solid state image sensor further includes a DAC having a different function than the ramp generation DAC and the gain control DAC.

The DAC having the different function is a clamp DAC that adds an offset to the ramp wave.

According to an aspect of the present technology, ramp waves are generated by ramp generation digital-to-analog converters (DACs), the number of which corresponds to different kinds of gains. Moreover, gain DAC output voltages corresponding to the different kinds of gains from a gain control DAC that controls an output gain of the ramp wave are individually held by respective sample hold circuits, the number of which corresponds to the different kinds of gains.

Effects of the Invention

According to the present technology, a gain transition can be performed. In particular, according to the present technology, the gain transition can be performed at high speed.

Note that the effects described in the present specification are merely examples, and the effects of the present technology are not limited to the effects described in the present specification. Any additional effect may also be obtained.

BRIEF DESCRIPTION OF DRAWINGS

FIG. 16 is a block diagram illustrating a configuration example of an electronic apparatus to which the present technology is applied.

MODE FOR CARRYING OUT THE INVENTION

Hereinafter, modes for carrying out the present disclosure (hereinafter referred to as "embodiments") will be described. Note that the description will be provided in the following order:

0. SCHEMATIC CONFIGURATION EXAMPLE OF SOLID STATE IMAGE SENSOR

1. FIRST EMBODIMENT (EXAMPLE OF RAMP GENERATION CIRCUIT OF PRESENT TECHNOLOGY)

2. SECOND EMBODIMENT (ANOTHER EXAMPLE OF RAMP GENERATION CIRCUIT OF PRESENT TECHNOLOGY)

3. THIRD EMBODIMENT (EXAMPLE OF ELECTRONIC APPARATUS)

0. Schematic Configuration Example of Solid State Image Sensor

<Schematic Configuration Example of Solid State Image Sensor>

Figure 1:
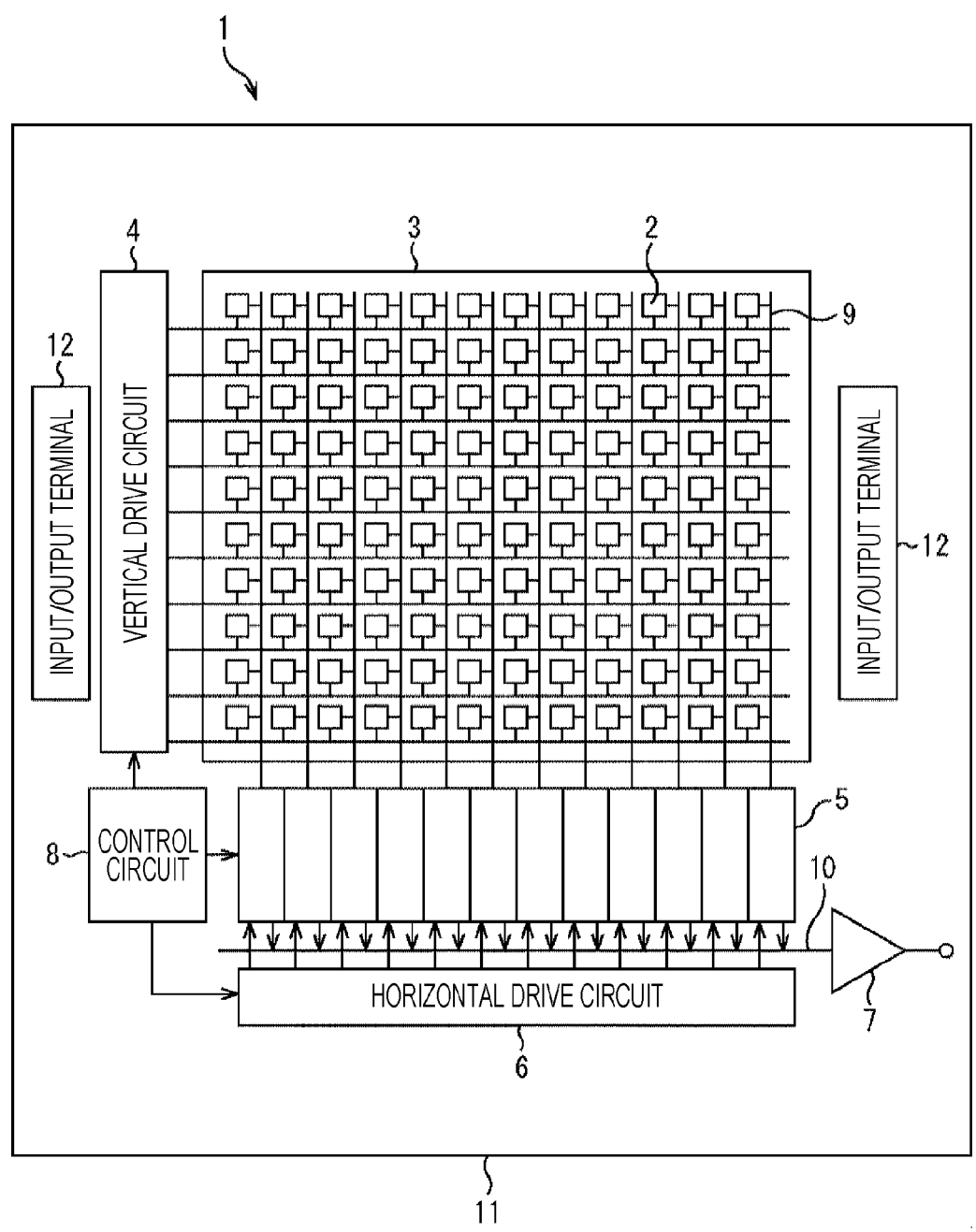
FIG. 1 is a block diagram illustrating a schematic configuration example of a solid state image sensor to which the present technology is applied.

In FIG. 1, a schematic configuration example of an exemplary complementary metal oxide semiconductor (CMOS) solid state image sensor that is applied to each embodiment of the present technology is illustrated.

As illustrated in FIG. 1, the solid state image sensor (element chip) 1 includes a pixel region (so-called imaging region) 3 and a peripheral circuit unit. In the pixel region 3, pixels 2 including a plurality of photoelectric conversion elements are regularly and two-dimensionally arrayed on a semiconductor substrate 11 (e.g., silicon substrate).

The pixel 2 has the photoelectric conversion element (e.g., photodiode) and a plurality of pixel transistors (so-called MOS transistors). The plurality of pixel transistors can include, for example, three transistors, that is, a transfer transistor, a reset transistor, and an amplification transistor, or can include four transistors by further adding a selection transistor. Since an equivalent circuit of each pixel 2 (unit pixel) is similar to a commonly used one, a detailed description thereof is omitted herein.

Alternatively, the pixel 2 can have a sharing pixel structure. The pixel sharing structure includes a plurality of photodiodes, a plurality of transfer transistors, a single floating diffusion that is shared, and other different pixel transistors that are shared.

The peripheral circuit unit includes a vertical drive circuit 4, a column signal processing circuit 5, a horizontal drive circuit 6, an output circuit 7, and a control circuit 8.

The control circuit 8 receives an input clock and data for giving an instruction about an operation mode or the like, and outputs data such as internal information of the solid state image sensor 1. More specifically, the control circuit 8 generates a clock signal and a control signal on the basis of a vertical synchronizing signal, a horizontal synchronizing signal, and a master clock. The clock signal and the control signal serve as a standard for operation of the vertical drive circuit 4, the column signal processing circuit 5, and the horizontal drive circuit 6. Then, the control circuit 8 inputs these signals to the vertical drive circuit 4, the column signal processing circuit 5, and the horizontal drive circuit 6.

The vertical drive circuit 4 includes, for example, a shift register. The vertical drive circuit 4 selects pixel drive wiring, supplies a pulse for driving the pixels 2 to the selected pixel drive wiring, and drives the pixels 2 in units of rows. More specifically, the vertical drive circuit 4 selectively and sequentially scans the pixels 2 in the pixel region 3 in units of rows in a vertical direction, and supplies, to the column signal processing circuit 5 through a vertical signal line 9, a pixel signal that is based on a signal charge generated in accordance with an incident light amount in the photoelectric conversion element of each pixel 2.

The column signal processing circuit 5 is arranged, for example, for each column of the pixels 2, and performs, on a signal output from a row of the pixels 2, a signal process such as noise elimination for each pixel column. More specifically, the column signal processing circuit 5 performs the signal process such as correlated double sampling (CDS) for eliminating fixed pattern noise unique to the pixel 2, signal amplification, and analog/digital (A/D) conversion. On an output stage of the column signal processing circuit 5, a horizontal selection switch (not illustrated) is provided to be connected to a horizontal signal line 10.

The horizontal drive circuit 6 includes, for example, a shift register. The horizontal drive circuit 6 sequentially outputs horizontal scanning pulses to select the respective column signal processing circuits 5 in order, and causes each of the column signal processing circuits 5 to output a pixel signal to the horizontal signal line 10.

The output circuit 7 performs a signal process on signals sequentially supplied from the respective column signal processing circuits 5 through the horizontal signal line 10, and outputs the signals. The output circuit 7 may perform, for example, only buffering, or may perform black level adjustment, column variation correction, and various digital signal processes or the like.

An input/output terminal 12 is provided for exchanging signals with the outside.

<Configuration Example of A/D Conversion Circuit>

Figure 2:
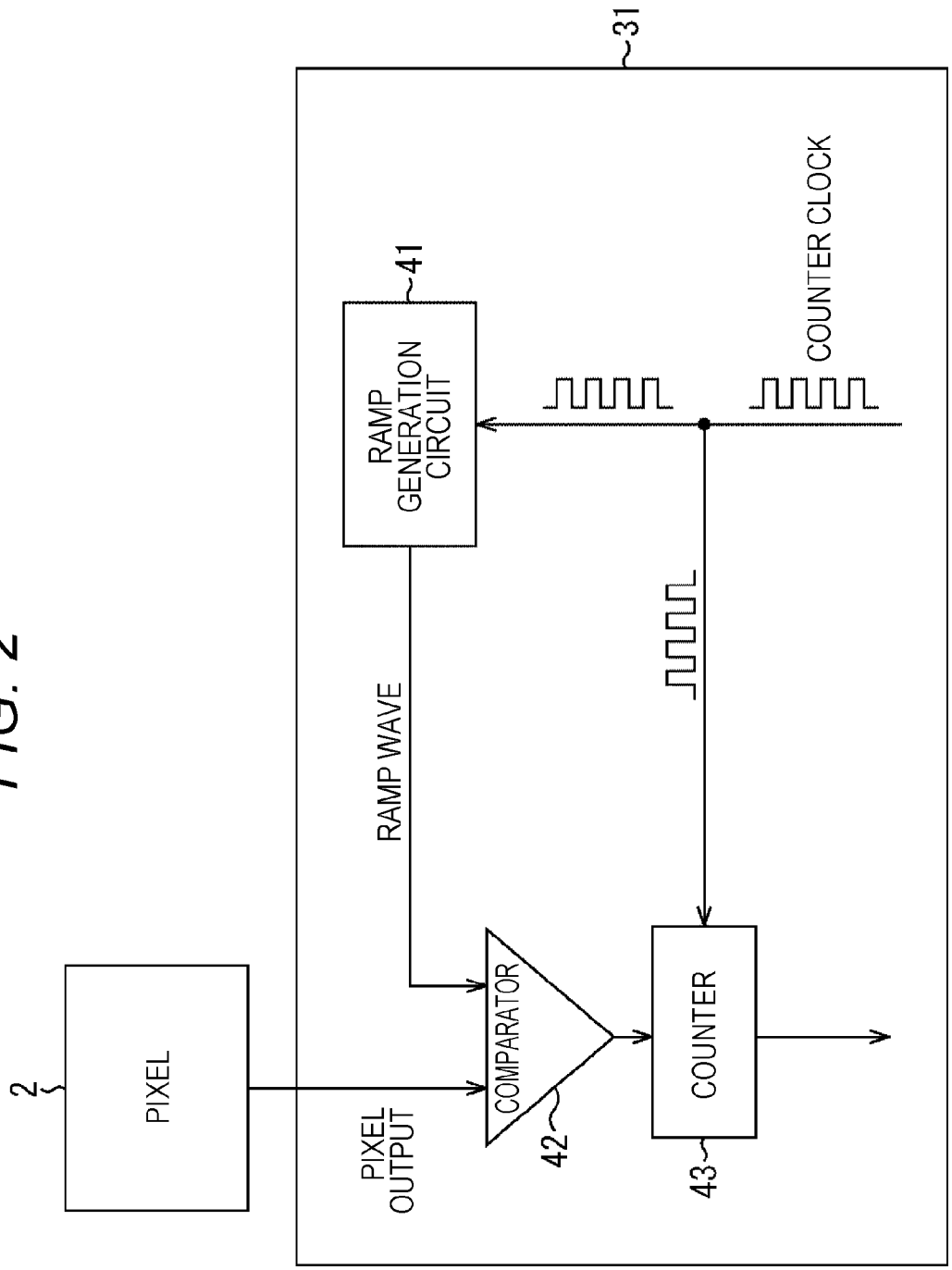
FIG. 2 is a block diagram illustrating a configuration example of an A/D conversion circuit that is used in the solid state image sensor.

FIG. 2 is a block diagram illustrating a configuration example of an A/D conversion circuit that is used in the solid state image sensor in FIG. 1. In the example of FIG. 2, a ramp A/D conversion circuit with the use of a digital-to-analog converter (DAC) is illustrated. In the ramp A/D conversion, a slope of a ramp is changed, whereby a gain for the A/D conversion is made variable.

The A/D conversion circuit 31 includes a ramp generation circuit 41, a comparator 42, and a counter 43.

The ramp generation circuit 41 includes, for example, a DAC. The ramp generation circuit 41 generates a ramp wave on the basis of a timing of a counter clock, and outputs the generated ramp wave to the comparator 42.

The comparator 42 compares a voltage of the ramp wave output from the ramp generation circuit 41 with the pixel signal from the pixel 2, and outputs the result (output value) to the counter 43.

The counter 43 counts the counter clock, and outputs a counter value to a later stage (not illustrated) on the basis of the output value from the comparator 42.

In the A/D conversion with the use of the counter 43, the voltage is converted into time, whereby an analog value is converted into a digital value. This operation will be briefly described with reference to FIG. 3.

Figure 3:
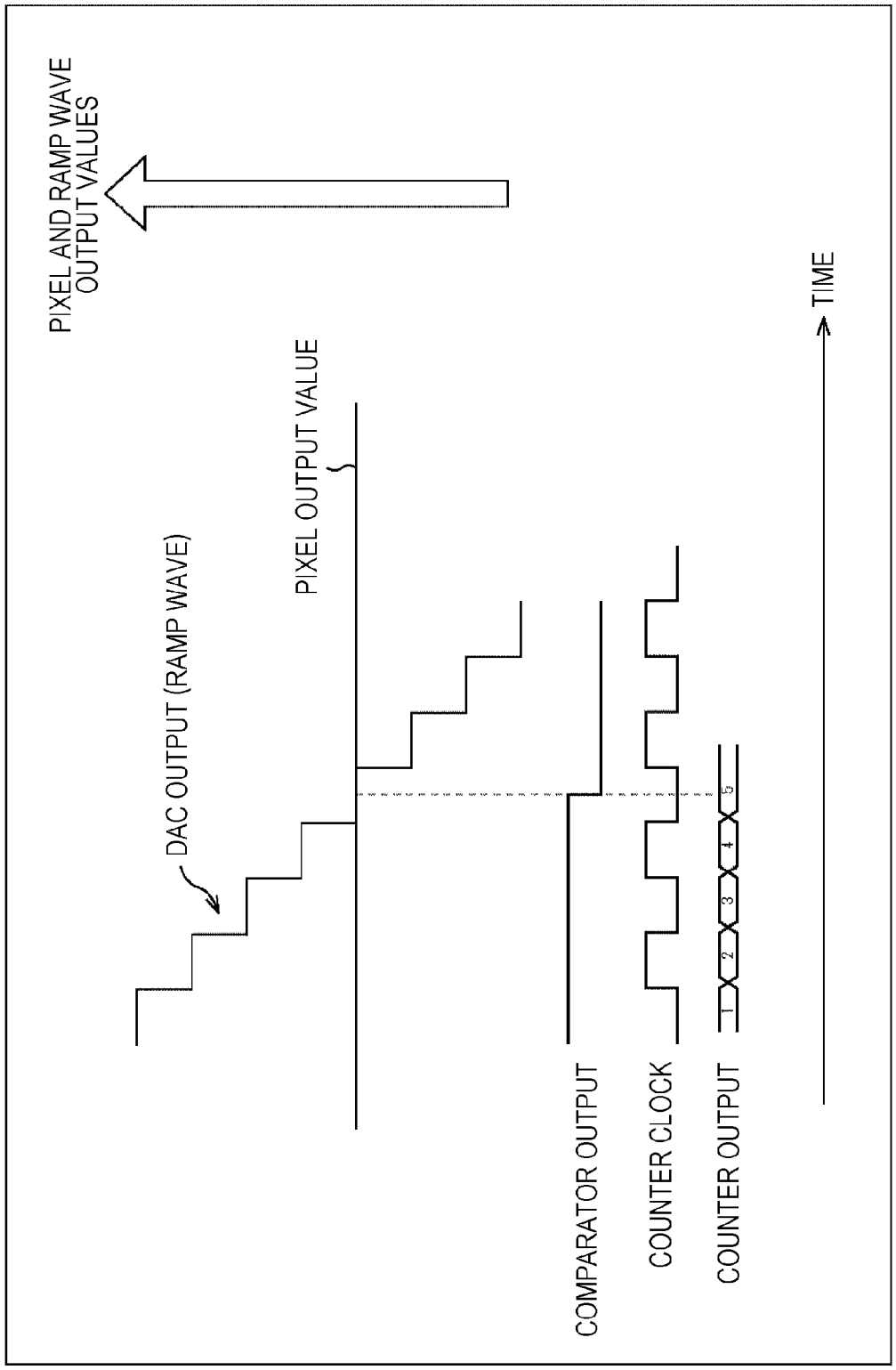
FIG. 3 is a timing chart illustrating exemplary operation of the A/D conversion circuit.

FIG. 3 is a diagram illustrating a timing chart in which a horizontal axis represents time.

In the example of FIG. 3, DAC output is a waveform of the ramp wave output from the ramp generation circuit 41 in FIG. 2. A pixel output value is a value of the pixel signal output from the pixel 2 in FIG. 2. Comparator output is the output value of the comparator 42 in FIG. 2. Counter output is an output value (count) of the counter 43 in FIG. 2. This example is based on the assumption that the counter 43 is, for example, a double date rate (DDR) counter. The DDR counter as used herein is a counter that uses both rising and falling of a clock to rewrite data.

Output of the DAC output (ramp wave) sequentially decreases at the same rate at timings of both the rising and the falling of the counter clock as the time progresses. The counter 43 counts both the rising and the falling of the counter clock. Once the magnitude relation between the pixel and the ramp wave satisfies ramp wave output value<pixel output value, the output of the comparator 42 is inverted. When the output of the comparator 42 is inverted, the counter 43 stops, and the value of the counter 43 is output from the solid state image sensor 1 as the counter value. In other words, the count value obtained when the pixel output and the output of the ramp waveform intersect is a digital value of the pixel output.

Meanwhile, in the example of FIG. 3, the ramp waveform is such a waveform that the output decreases at a fixed rate as the time progresses. However, this is illustrated as a typical example, and the ramp waveform is not particularly limited. For example, contrary to FIG. 3, a waveform that increases at a fixed rate as the time progresses can also be described in a similar manner. Additionally, the counter 43 illustrated herein is also only an example, and the kind of the counter is not particularly limited.

Figure 4:
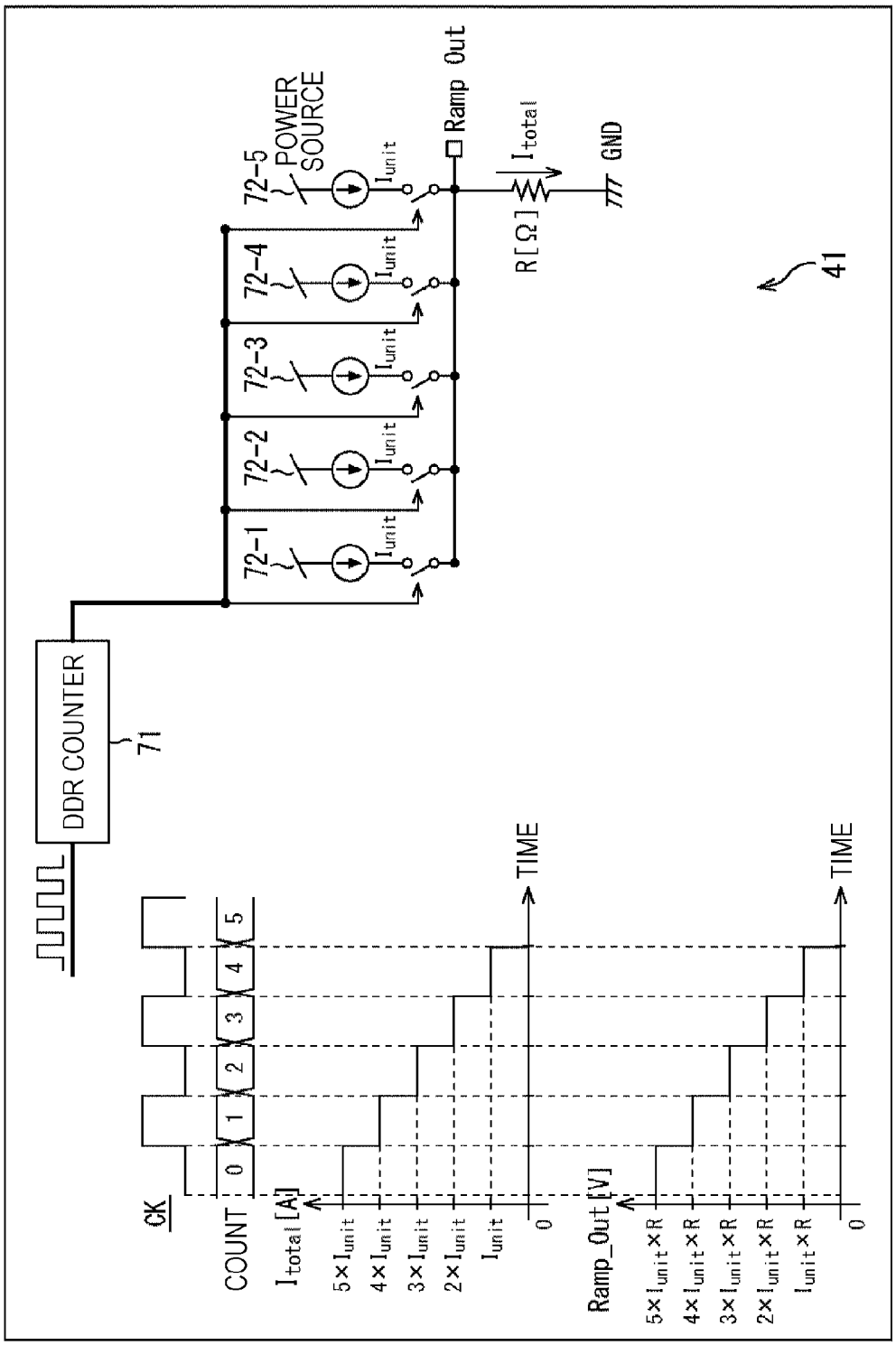
FIG. 4 is a diagram explaining a configuration and circuit operation of a ramp generation circuit for which a DDR counter is used.

Next, with reference to FIG. 4, a configuration and circuit operation of the ramp generation circuit for which the DDR counter is used will be described. In the example of FIG. 4, the example in which five current sources 72-1 to 72-5 that are identical to one another are included, and the current sources 72-1 to 72-5 are controlled by the DDR counter 71 will be described.

The counter clock is input to the DDR counter 71, and the current sources 72-1 to 72-5 of the ramp generation circuit 41 are configured to be controlled by the output of the DDR counter 71. Ramp_Out is terminated at a resistor R [Ω], and output of Ramp_Out is $I_{total} \times R$ [V]. In the ramp generation circuit 41, the DDR counter 71 is used to count the counter clock.

As illustrated in a timing chart of FIG. 4, the count of the DDR counter 71 continues progressing at both the rising and the falling of the counter clock. Then, the current sources 72-1 to 72-5 are controlled to be turned off so that the number of current sources 72-1 to 72-5 to be turned off corresponds to the count value. When the count progresses by one by means of such control, $I_{total}$ decreases by $I_{unit}$ [A] corresponding to a single current source, and the voltage of Ramp_Out also decreases by $I_{unit} \times R$ [V].

On the assumption that the rising and the falling of the counter clock alternately occur at fixed intervals (i.e. H period=L period), when the current sources are turned off so that the number of current sources to be turned off corresponds to the count value n in the above-mentioned manner, the ramp waveform that decreases at fixed intervals as illustrated in FIG. 3 is generated.

<Another Configuration and Operation of Ramp Wave Generation Circuit>

Figure 5:
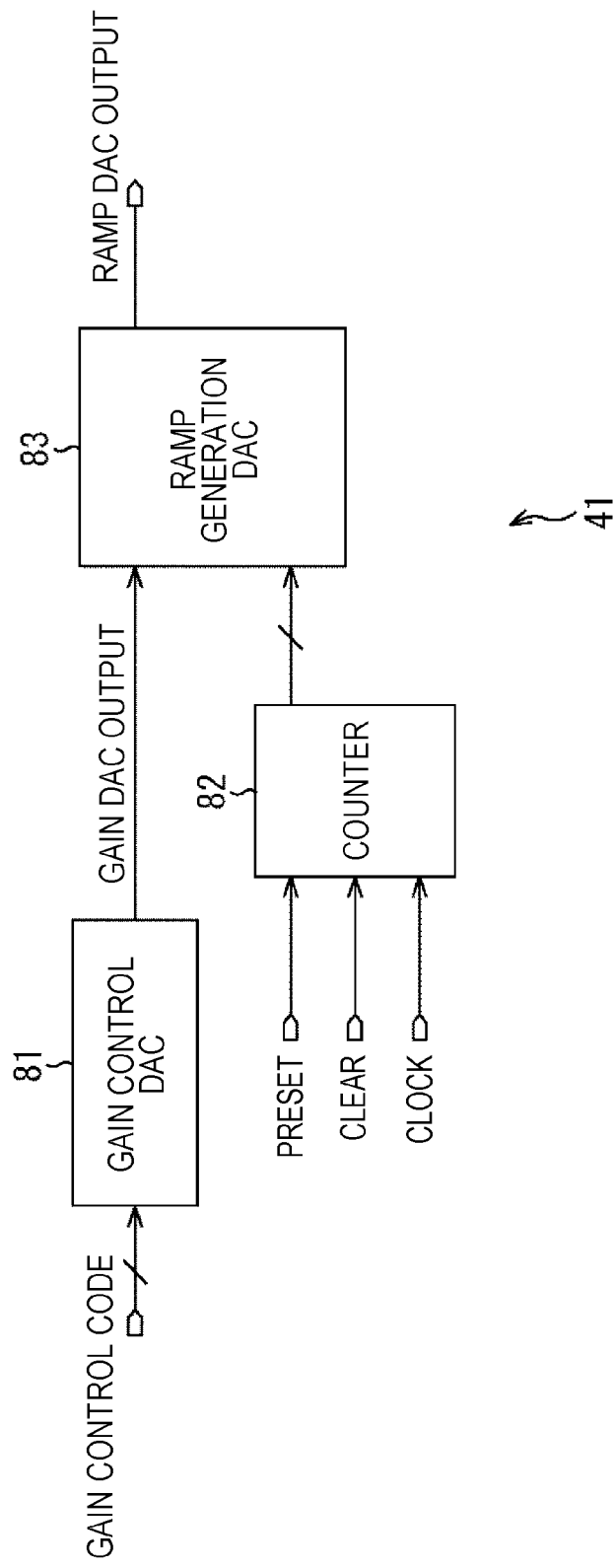
FIG. 5 is a block diagram illustrating another configuration example of the ramp generation circuit.
Figure 6:
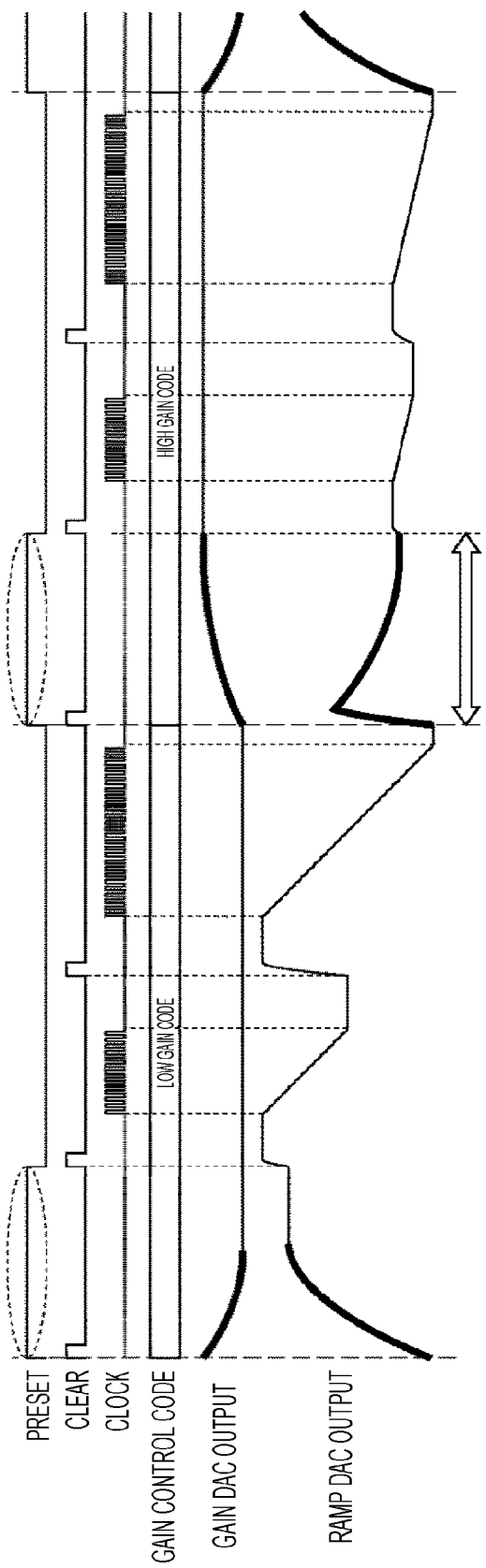
FIG. 6 is a timing chart illustrating operation of the ramp generation circuit.

Next, with reference to FIGS. 5 and 6, another configuration and operation of the ramp generation circuit will be described. FIG. 5 is a block diagram illustrating another configuration example of the ramp generation circuit. FIG. 6 is a timing chart illustrating the operation of the ramp generation circuit.

In the example of FIG. 5, the ramp generation circuit 41 includes a gain control DAC 81, a counter 82, and a ramp generation DAC 83. Note that a gain control code, a preset signal, a clear signal, and a clock signal are signals that are input, for example, from the outside or the control circuit 8.

The gain control codes representing different kinds of gains, e.g., a low gain code or a high gain code, are input to the gain control DAC 81. The gain control DAC 81 controls an output gain of the ramp wave on the basis of the gain control code, and outputs gain DAC output illustrated in FIG. 6 to the ramp generation DAC 83.

More specifically, the gain control DAC 81 changes a current value per LSB for the ramp generation DAC 83 to change the slope of the ramp wave.

Figure 7:
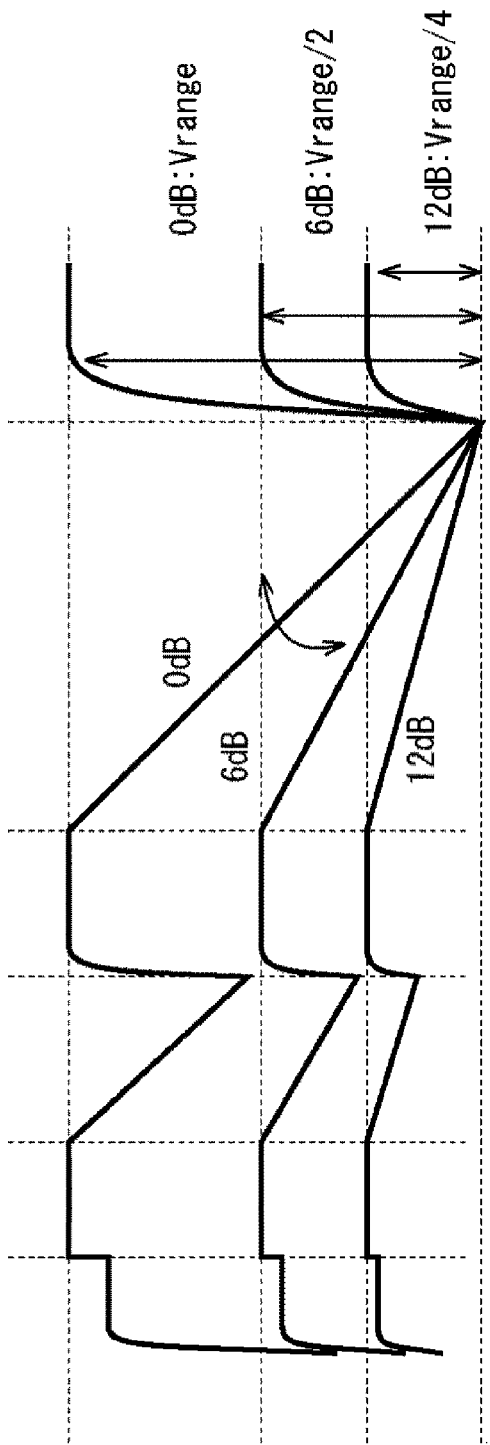
FIG. 7 is a diagram illustrating waveforms of ramp DAC output.

FIG. 7 is a diagram illustrating waveforms of ramp DAC output. Assuming that Vrange (amplitude) at 0 dB is one, Vrange (amplitude) at 6 dB is 1/2, and Vrange (amplitude) at 12 dB is 1/4. Note that, in practice, the amplitude of 6 dB is about 1/1.995 . . . times as large as the amplitude of 0 dB, and the amplitude of 12 dB is 1/3.98 . . . times as large as the amplitude of 0 dB. However, for simplifying the explanation, it is assumed herein that the amplitude of 6 dB is twice as large, and that of 12 dB is four times as large. Specifically, it is understood from the waveforms illustrated in FIG. 7 that the more gradual the slope is, the longer the time required for attainment of a certain voltage is. Note that "an increase in the gain" is used to paraphrase the fact that the more gradual the slope is, the longer the time required for attainment of a certain voltage is.

For example, the gain control DAC 81 multiplies a reference current (Iref) by A to generate a current for the ramp generation DAC 83. Assuming that the current from the gain control DAC 81 at 0 dB (once as large) is Iref*A, the current at 6 dB (twice as large) is Iref*(A/2). In this manner, the current for the ramp generation DAC 83 is controlled by the gain control DAC 81.

Note that the reason why the large amplitude of the ramp means the low gain and the small amplitude of the ramp means the high gain is that, considering a low gain and a high gain of an analog gain, the voltage of 1 LSB of the ramp at the low gain is large and that at the high gain is small. In a case where an output voltage of a pixel remains at the same level, time (the number of counts) that elapses before the ramp wave intersects the output voltage is short at the low gain and long at the high gain.

Figure 8:
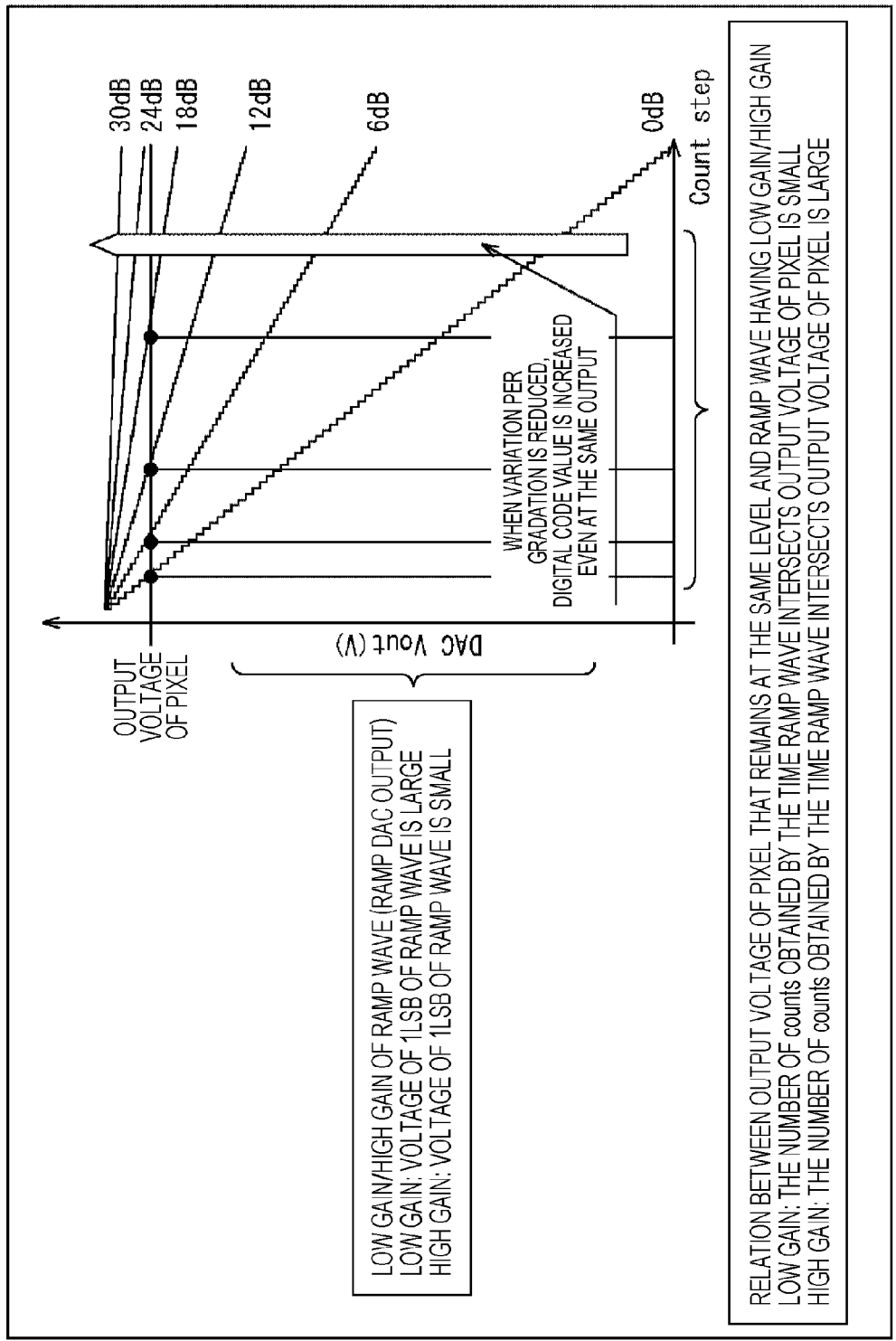
FIG. 8 is a diagram illustrating a graph in which ramps having different degrees of amplitude are put over an output voltage of a pixel that remains at the same level.

For example, as illustrated in FIG. 8, this is well understood when ramps having different degrees of amplitude are put over the output voltage of the pixel that remains at the same level.

Specifically, in the ramp wave, the voltage of 1 LSB of the ramp is large at the low gain, and the voltage of 1 LSB of the ramp is small at the high gain. In addition, regarding the relation between the output voltage of the pixel that remains at the same level and the ramp wave having the low gain/high gain, the number of counts obtained by the time the ramp intersects the output voltage of the pixel is small at the low gain, and the number of counts obtained by the time the ramp intersects the output voltage of the pixel is large at the high gain.

Returning to FIG. 5, each of the preset, clear, and clock signals is input to the counter 82. The preset signal is a signal for adjusting an input voltage for the comparator 42 during a period in which the preset signal rises as illustrated by dotted lines in FIG. 6. The clear signal is a signal for trying to restore the waveform of the ramp DAC output to an initial value once. The clock signal is a signal for causing the waveform of the ramp DAC output to fall obliquely. In accordance with these signals, the counter 82 outputs an output code to the ramp generation DAC 83. Specifically, the waveform of the ramp DAC output illustrated in FIG. 6 is formed by each of the preset, clear, and clock signals.

The ramp generation DAC 83 generates the ramp wave, and outputs the generated ramp wave. Specifically, the ramp generation DAC 83 is a circuit from which the voltage that depends on the output code of the counter 82 is output as the ramp DAC output (ramp wave). Regarding the output level of the ramp generation DAC 83, a voltage variation amount per code of the counter varies in accordance with a voltage value of the gain DAC output from the gain control DAC 81.

As described above, in a case where the gain is changed in the ramp generation circuit 41, the gain DAC output varies as illustrated by thick lines in FIG. 6 using the variation in the gain control code as a trigger. Therefore, as illustrated by an arrow in FIG. 6, a wait for a gain settling period (period from the switch of the gain code to settlement thereof) of the ramp DAC output is required.

However, in a case where the A/D conversion needs to be performed while the gain is frequently changed, the settling period is likely to become a drag on the high-speed A/D conversion.

In view of the above-mentioned circumstances, in the present technology, ramp generation DACs and sample hold circuits that individually hold respective gain DAC output voltages at different gains are provided in accordance with the number of kinds of required gains. Hereinafter, the present technology will be described in detail.

1. First Embodiment

<Configuration Example of Ramp Generation Circuit of Present Technology>

Figure 9:
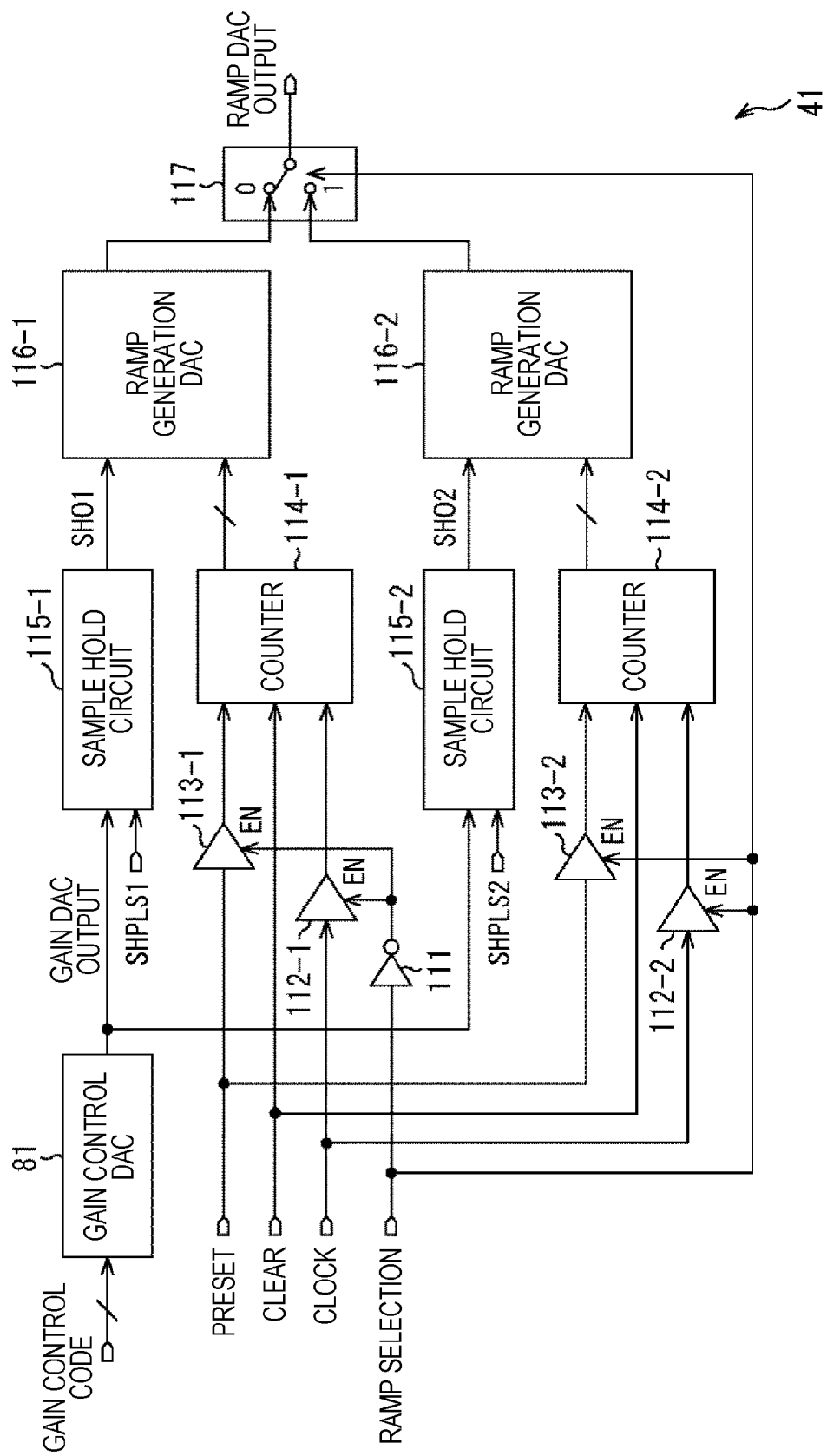
FIG. 9 is a block diagram illustrating a configuration example of the ramp generation circuit to which the present technology is applied.

FIG. 9 is a block diagram illustrating a configuration example of the ramp generation circuit to which the present technology is applied.

The ramp generation circuit 41 in FIG. 9 has the gain control DAC 81 in common with the ramp generation circuit 41 in FIG. 5.

However, the ramp generation circuit 41 in FIG. 9 is different from the ramp generation circuit 41 in FIG. 5 in that an inverter 111, buffers 112-1 and 112-2, buffers 113-1 and 113-2, sample hold circuits 115-1 and 115-2, and an output switch 117 are added. In addition, the ramp generation circuit 41 in FIG. 7 is different from the ramp generation circuit 41 in FIG. 5 in that the counter 82 and the ramp generation DAC 83 are replaced by counters 114-1 and 114-2 and ramp generation DACs 116-1 and 116-2, respectively.

Specifically, the preset signal is input to the buffers 113-1 and 113-2. The clear signal is input to the counters 114-1 and 114-2. The clock signal is input to the buffers 112-1 and 112-2. A ramp selection signal is input to the inverter 111, the buffers 112-2 and 113-2, and the output switch 117. Note that the ramp selection signal is also a signal that is input, for example, from the outside or the control circuit 8.

The inverter 111 inverts the ramp selection signal, and outputs it to the buffers 112-1 and 113-1. The buffer 112-1 outputs, in response to input of an enable signal (EN) from the inverter 111, the input clock signal to the counter 114-1. The buffer 113-1 outputs, in response to the input of the enable signal (EN) from the inverter 111, the input preset signal to the counter 114-1.

When the ramp selection signal is the enable signal (EN), the buffer 112-2 outputs the input clock signal to the counter 114-2. When the ramp selection signal is the enable signal (EN), the buffer 113-2 outputs the input preset signal to the counter 114-2.

The counter 114-1 outputs the output code to the ramp generation DAC 116-1 in accordance with each of the input preset, clear, and clock signals. The counter 114-2 outputs the output code to the ramp generation DAC 116-2 in accordance with each of the input preset, clear, and clock signals.

The gain control DAC 81 outputs the gain DAC output to the sample hold circuits 115-1 and 115-2 in accordance with the gain control code.

In response to input of a sample hold pulse (SHPLS) 1 during the input of the low gain code, the sample hold circuit 115-1 recharges itself with a leak of a gain DAC output voltage SH01 at a low gain for the ramp generation DAC 116-1, and holds the gain DAC output voltage SH01 at the low gain. Then, the sample hold circuit 115-1 outputs the held gain DAC output voltage at the low gain to the ramp generation DAC 116-1.

In response to input of a sample hold pulse (SHPLS) 2 during the input of the high gain code, the sample hold circuit 115-2 recharges itself with a leak of a gain DAC output voltage SH02 at a high gain for the ramp generation DAC 116-2, and holds the gain DAC output voltage SH02 at the high gain. Then, the sample hold circuit 115-2 outputs the held gain DAC output voltage at the high gain to the ramp generation DAC 116-2.

The ramp generation DAC 116-1 generates the ramp wave, and outputs the generated ramp wave. Specifically, the ramp generation DAC 116-1 is a circuit from which the voltage that depends on the output code of the counter 114-1 is output as the ramp DAC output (ramp wave). The output level of the ramp generation DAC 116-1 is held by the voltage value of the gain DAC output from the sample hold circuit 115-1.

The ramp generation DAC 116-2 generates the ramp wave, and outputs the generated ramp wave. Specifically, the ramp generation DAC 116-2 is a circuit from which the voltage that depends on the output code of the counter 114-2 is output as the ramp DAC output (ramp wave). The output level of the ramp generation DAC 116-2 is held by the voltage value of the gain DAC output from the sample hold circuit 115-2.

The output switch 117 performs a switch to the ramp DAC output from the ramp generation DAC 116-1 or 116-2 holding the required gain voltage in accordance with the ramp selection signal. Specifically, the output switch 117 selects the ramp DAC output from the ramp generation DAC 116-1 when the ramp selection signal is a disable signal (0), and selects the ramp DAC output from the ramp generation DAC 116-2 when the ramp selection signal is an enable signal (1).

As described above, the ramp generation circuit 41 in FIG. 9 includes the sample hold circuits 115-1 and 115-2 and the ramp generation DACs 116-1 and 116-2, the number of which depends on the kinds of required gains (in the example of FIG. 9, two kinds, i.e. the low gain and the high gain). Then, the sample hold circuits 115-1 and 115-2 can individually hold the gain DAC output voltages at the different gains. Note that the number that depends on the kinds of required gains is not limited to two, and only needs to be two or more, that is, the plural number.

The above-mentioned configuration enables the switch to the ramp generation DAC holding the required gain voltage by means of the ramp selection signal. Consequently, the switch of the gain no longer depends on the settling of the gain DAC output, whereby the high-speed gain transition can be realized.

Note that the gain control DAC 81 is shared between the ramp generation DACs 116-1 and 116-2 in the example of FIG. 9. Consequently, variations in the circuit area and characteristics can be suppressed. However, the gain control DAC 81 can be provided such that the number of gain control DACs 81 depends on the kinds of required gains.

Next, with reference to a timing chart in FIG. 10, the operation of the ramp generation circuit 41 in FIG. 9 will be described.

Figure 10:
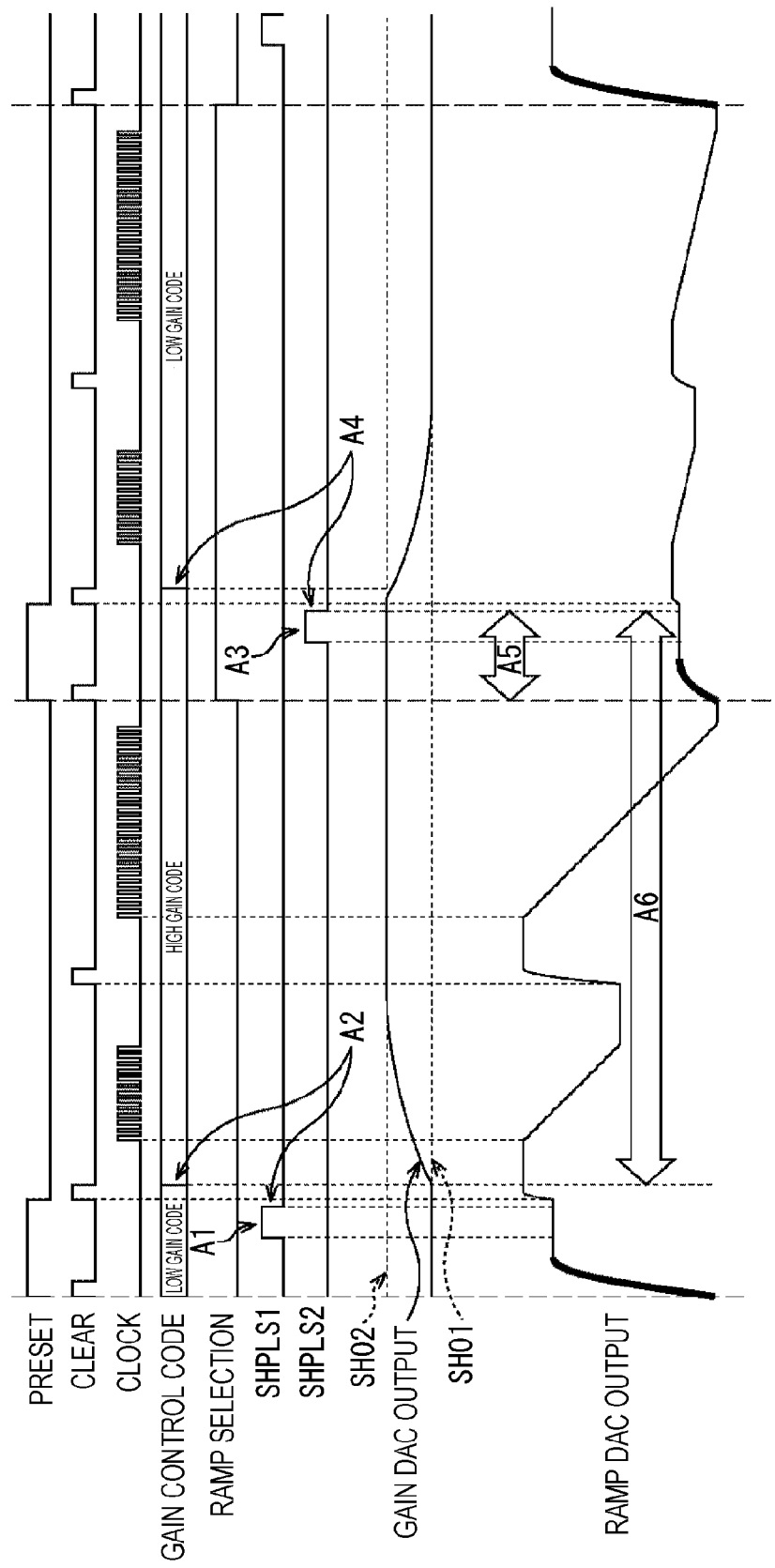
FIG. 10 is a timing chart illustrating operation of the ramp generation circuit in FIG. 9.

In the example of FIG. 10, the timing chart of the preset signal, the clear signal, the clock signal, the gain control code, the ramp selection signal, SHPLS1, SHPLS2, SH02, the gain DAC output, SH01, and the ramp DAC output is illustrated, in order from above.

SHPLS1 is input at a timing illustrated by an arrow A1. At this time, the gain control code represents the low gain code. Therefore, the sample hold circuit 115-1 turns on a built-in switch, recharges itself with the leak of the gain DAC output voltage SH01 at the low gain for the ramp generation DAC 116-1, and holds the gain DAC output voltage SH01 at the low gain.

In this case, the gain DAC output voltage SH01 at the low gain is held. Therefore, the sample hold circuit 115-1 turns off the built-in switch. Then, at a timing illustrated by arrows A2, the gain control DAC 81 enables a switch to a use gain code (high gain code) of the ramp generation DAC 116-2.

In a similar manner, SHPLS2 is input at a timing illustrated by an arrow A3. At this time, the gain control code represents the high gain code. Therefore, the sample hold circuit 115-2 turns on a built-in switch, recharges itself with the leak of the gain DAC output voltage SH02 at the high gain for the ramp generation DAC 116-2, and holds the gain DAC output voltage SH02 at the high gain.

In this case, since the gain DAC output voltage SH02 at the high gain is held, the sample hold circuit 115-2 turns off the built-in switch. Then, at a timing illustrated by arrows A4, the gain control DAC 81 enables a switch to a use gain code (low gain code) of the ramp generation DAC 116-1.

Note that, in the ramp generation circuit 41, since the gain control code can be changed at a point of time before the gain state of the ramp DAC output in FIG. 9 is switched, the switch of the gain state of the ramp DAC output is performed by the ramp selection signal.

Specifically, a period corresponding to the settling period of the ramp generation circuit 41 in FIG. 5 is a period illustrated by an arrow A5, which has an influence on the A/D conversion period. To the contrary, a settling period of the ramp generation circuit 41 in FIG. 9 is a period illustrated by an arrow A6, which has no influence on the A/D conversion period. Consequently, the high-speed gain transition can be realized.

As described above, after each of the sample hold circuits 115-1 and 115-2 enters the hold state, the gain DAC output can be varied. Consequently, the gain control code can be changed at a point of time before the gain state of the ramp DAC output is switched. Therefore, the gain DAC and the ramp DAC can operate in a pipeline manner and in a time-division manner, whereby the settling of the gain DAC output does not interfere in the A/D conversion period.

In addition, the voltage level held by each of the sample hold circuits 115-1 and 115-2 is the same as the voltage level of the ramp generation circuit 41 in FIG. 5. Therefore, in a case where the leaks occur in the sample hold circuits 115-1 and 115-2, the sample hold circuits 115-1 and 115-2 only need to be recharged with the leaks. However, it is better to provide start-up operation with a long sample period at the time of startup.

<Exemplary Circuit of Ramp Generation Circuit of Present Technology>

Figure 11:
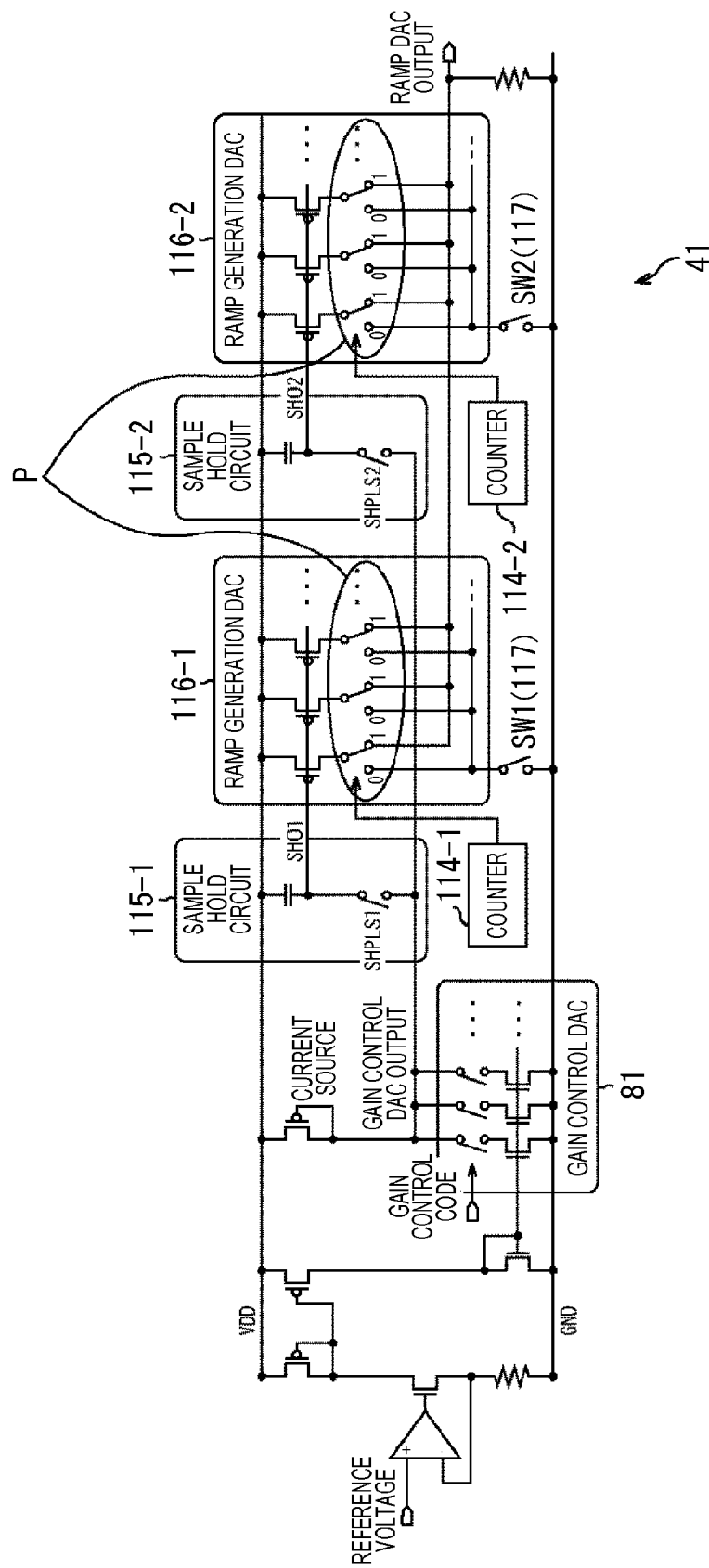
FIG. 11 is a circuit diagram illustrating a configuration example of the ramp generation circuit to which the present technology is applied.

FIG. 11 is a circuit diagram illustrating a configuration example of the ramp generation circuit to which the present technology is applied. Note that the circuit diagram in FIG. 11 describes in detail the gain control DAC 81, the counters 114-1 and 114-2, the sample hold circuits 115-1 and 115-2, and the ramp generation DACs 116-1 and 116-2 of the ramp generation circuit 41 in FIG. 9. Therefore, descriptions of other components illustrated in the example of FIG. 11, namely, a reference voltage, VDD, GND, a resistor, and a current source or the like, will be omitted.

The gain control DAC 81 turns on/off a built-in switch in accordance with the gain control code, thereby outputting the gain DAC output to the sample hold circuits 115-1 and 115-2.

Each of the sample hold circuits 115-1 and 115-2 turns on the built-in switch in accordance with the input of SHPLS1 or SHPLS2, thereby recharging itself with the gain DAC output from the gain control DAC 81. Each of the sample hold circuits 115-1 and 115-2 outputs, to the corresponding one of the ramp generation DACs 116-1 and 116-2, the gain DAC output subjected to the recharge as the corresponding one of SH01 and SH02.

In addition, each of the sample hold circuits 115-1 and 115-2 turns off the built-in switch when SHPLS1 or SHPLS2 is not input, thereby blocking the gain DAC output from the gain control DAC 81.

Each of the ramp generation DACs 116-1 and 116-2 sequentially switches built-in switches at the output of the corresponding one of the counters 114-1 and 114-2 from one to zero to generate the ramp wave, and outputs the generated ramp wave as the ramp DAC output. Specifically, the operation of gradually turning off the current sources and sequentially reducing the output of the ramp wave is performed.

Meanwhile, at one of the ramp generation DACs 116-1 and 116-2 to which the ramp selection disable signal has been input, all the built-in switches at the output of the corresponding one of the counters 114-1 and 114-2 are switched to zero and connected to the corresponding one of SW1 and SW2 to turn off the corresponding one of SW1 and SW2. Note that SW1 and SW2 are switches corresponding to the output switch 117 in FIG. 9, and turned off by the input of the ramp selection disable signal. Consequently, the current for one of the ramp generation DACs 116-1 and 116-2 that is not used is turned off, whereby an increase in power consumption caused by the increased number of circuits can be reduced as much as possible.

Figure 12:
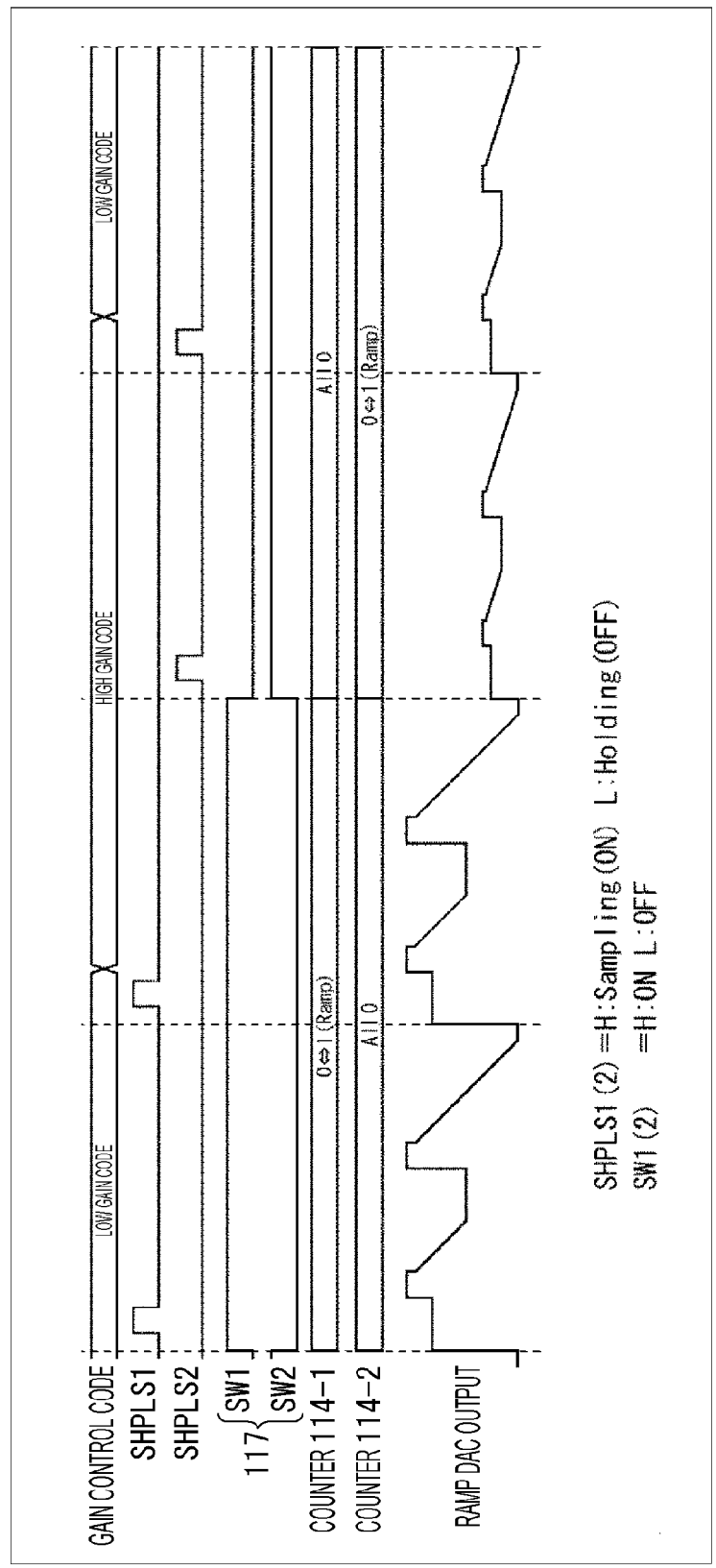
FIG. 12 is a timing chart illustrating operation of the ramp generation circuit in FIG. 11.

FIG. 12 is a timing chart illustrating the operation of the ramp generation circuit 41 in FIG. 11.

In the example of FIG. 12, the timing chart of the gain control code, SHPLS1, SHPLS2, SW1, SW2, the counter 114-1, the counter 114-2, and the ramp DAC output is illustrated, in order from above. Note that SW1 and SW2 are switches corresponding to the output switch 117 in FIG. 9, and turned on and off by the ramp selection signal.

As for the gain control code, the low gain code and the high gain code are alternately repeated, and each code lasts for a predetermined period (in the example of FIG. 12, for a period corresponding to two times of DAC output). Note that the two times of DAC output are only an example, and one time of DAC output or multiple times of DAC output may be employed. Additionally, the switch to the low gain code and the switch to the high gain code can be performed after different times of output.

SHPLS1 is turned on twice during a period in which SW1 is on and the gain control code is the low gain code, and causes the recharge of the leak of the gain DAC output voltage SH01 at the low gain for the ramp generation DAC 116-1. SHPLS2 is turned to H (on) twice during a period in which SW2 is H (on) and the gain control code is the high gain code, and causes the recharge of the leak of the gain DAC output voltage SH01 at the high gain for the ramp generation DAC 116-2.

SW1 and SW2 repeat a state in which one of them is turned to H (on) by the ramp selection signal while the other is turned to L (off). The counter 114-1 passes zero or one to the ramp generation DAC 116-1 during a period in which SW1 is H (on), and is entirely turned to zero during a period in which SW1 is L (off). The counter 114-2 passes zero or one to the ramp generation DAC 116-2 during a period in which SW2 is H (on), and is entirely turned to zero during a period in which SW2 is L (off).

The ramp DAC output becomes the ramp DAC output at the low gain for the ramp generation DAC 116-1 during a period in which SW1 is H (on), and becomes the ramp DAC output at the high gain for the ramp generation DAC 116-2 during a period in which SW2 is H (on).

Figure 13:
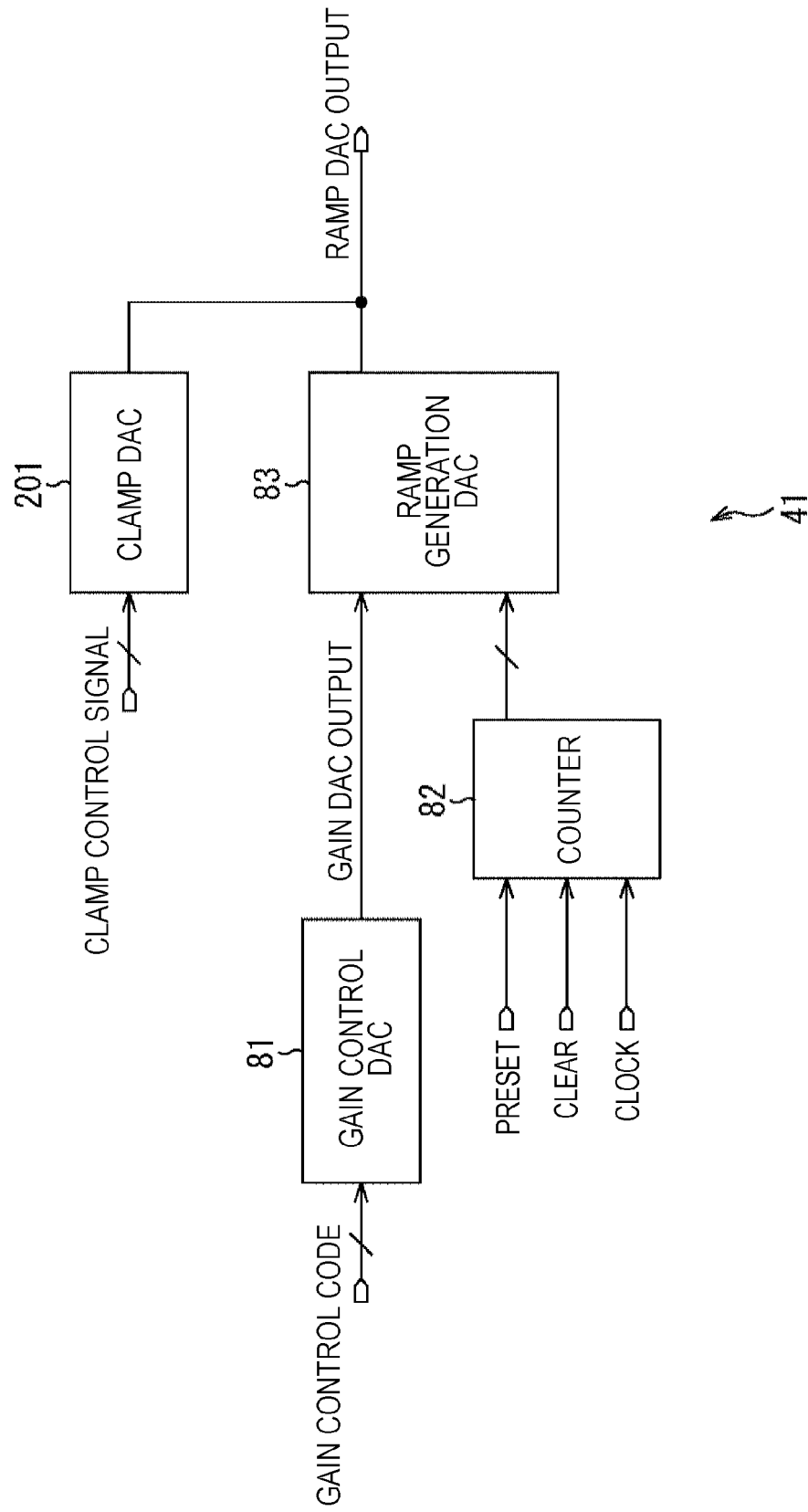
FIG. 13 is a block diagram illustrating another configuration example of the ramp generation circuit.

Note that although the above-mentioned ramp generation circuit is configured to include at least the gain control DAC and the ramp generation DAC, needless to say, the ramp generation circuit can be configured to include a DAC having another function. As an example of this, an exemplary clamp DAC is illustrated in FIG. 13 to be described later. However, the DAC having another function is not limited to the clamp DAC.

2. Second Embodiment

<Another Configuration Example of Ramp Generation Circuit>

FIG. 13 is a block diagram illustrating a configuration example of the ramp generation circuit.

The ramp generation circuit 41 in FIG. 13 includes the gain control DAC 81, the counter 82, and the ramp generation DAC 83 in common with the ramp generation circuit 41 in FIG. 9.

The ramp generation circuit 41 in FIG. 13 is different from the ramp generation circuit 41 in FIG. 5 in that a clamp DAC 201 is added. Note that a clamp control signal is also a signal that is input, for example, from the outside or the control circuit 8.

The clamp DAC 201 adds an offset to the ramp DAC output from the ramp generation ramp DAC 83 in accordance with the clamp control signal that performs control to turn on/off the clamp DAC 201.

Figure 14:
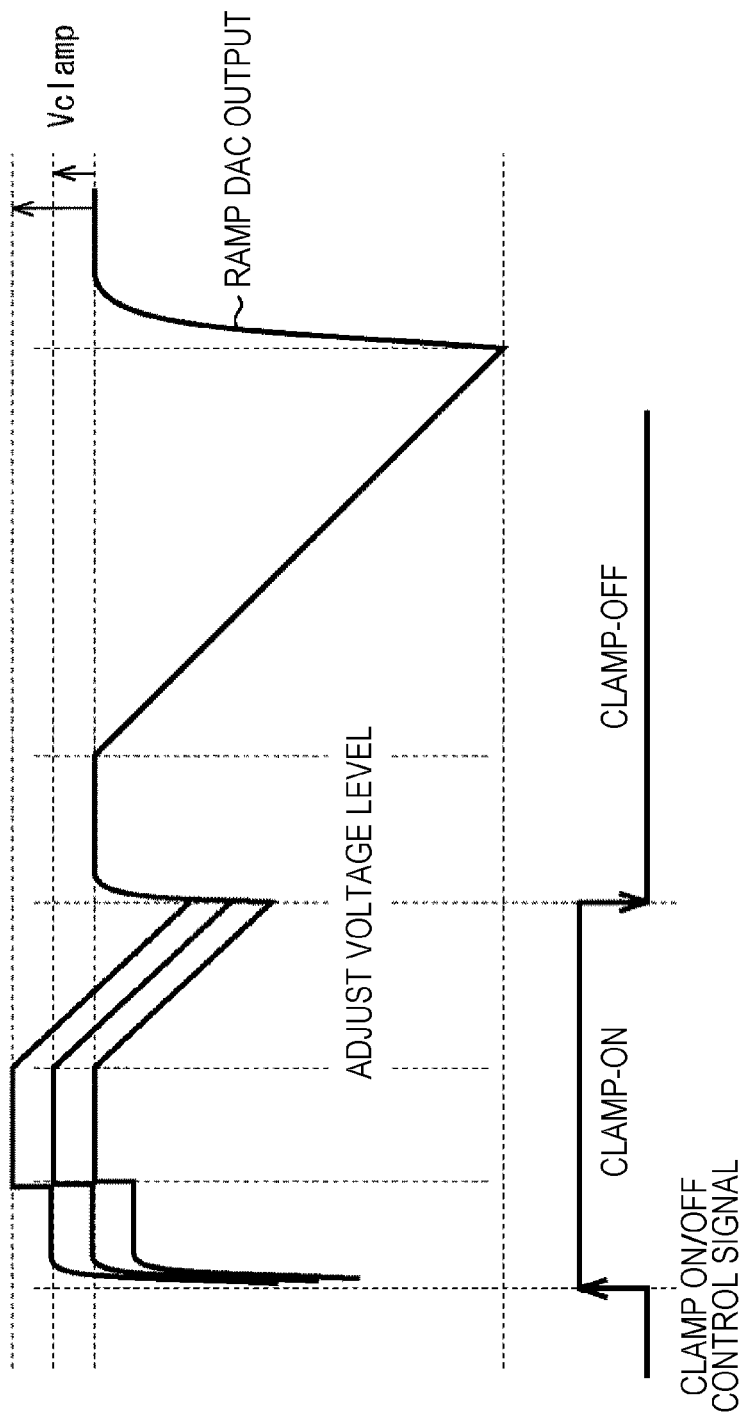
FIG. 14 is a diagram explaining a clamp DAC.

For example, when the clamp on/off control signal represents clamp-on, as illustrated in FIG. 14, the offset Vclamp is added to the ramp DAC output, and the voltage level can be adjusted. On the other hand, when the clamp on/off control signal represents clamp-off, as illustrated in FIG. 14, the offset Vclamp is not added to the ramp DAC output.

Consequently, the ramp DAC output to which the offset Vclamp has been added is output from the ramp generation circuit 41 in FIG. 13.

When the present technology is applied to the ramp generation circuit 41 in FIG. 13, the ramp generation circuit 41 is configured as illustrated in the following FIG. 15.

<Configuration Example of Ramp Generation Circuit of Present Technology>

Figure 15:
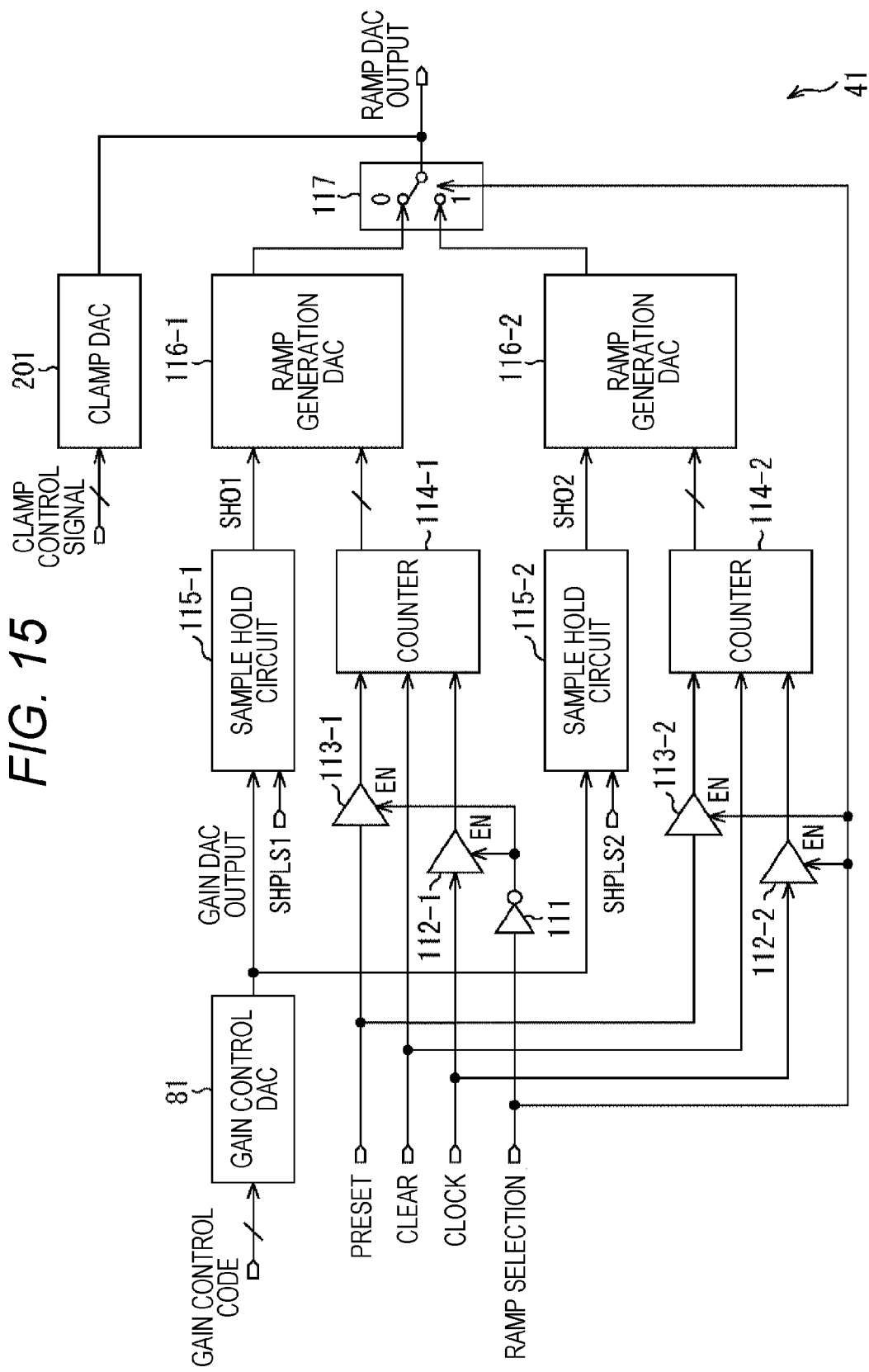
FIG. 15 is a block diagram illustrating another configuration example of the ramp generation circuit to which the present technology is applied.

FIG. 15 is a block diagram illustrating a configuration example of the ramp generation circuit to which the present technology is applied.

The ramp generation circuit 41 in FIG. 15 is configured to include the gain control DAC 81, the counter 82, the ramp generation DAC 83, the inverter 111, the buffers 112-1 and 112-2, the buffers 113-1 and 113-2, the sample hold circuits 115-1 and 115-2, and the output switch 117 in common with the ramp generation circuit 41 in FIG. 9.

The ramp generation circuit 41 in FIG. 15 is different from the ramp generation circuit 41 in FIG. 9 in that the clamp DAC 201 mentioned above with reference to FIG. 13 is added.

The clamp DAC 201 adds the offset to the ramp DAC output from the output switch 117 in accordance with the clamp control signal.

Consequently, in the ramp generation circuit 41 in FIG. 15 as well, for example, the offset Vclamp is added to the ramp DAC output when the clamp on/off control signal represents clamp-on as illustrated in FIG. 14, and the voltage level can be adjusted.

Note that the ramp generation circuit 41 in FIG. 15 has everything in common with the ramp generation circuit 41 in FIG. 9 except for the clamp DAC 201, and a detailed configuration and operation thereof are basically similar to those of the ramp generation circuit 41 in FIG. 9. Therefore, descriptions of them will be omitted to avoid repetition.

As described above, according to the technology, the sample hold circuits and the ramp generation DACs are included, the number of which depends on the kinds of required gains, and the gain DAC output voltages at the different gains are individually held by the sample hold circuits.

The above configuration enables the switch to the ramp generation DAC holding the required gain voltage by means of the ramp selection signal. Consequently, the switch of the gain no longer depends on the settling of the gain DAC output, whereby the high-speed gain transition can be realized.

In addition, since only the required components such as the single gain control DAC are provided so that the number of components depends on the kinds of required gains, variations in the circuit area and characteristics can be suppressed.

Note that although the configuration in which the present technology is applied to the CMOS solid state image sensor has been described so far, the present technology may be applied to a solid state image sensor such as a charge coupled device (CCD) solid state image sensor.

Additionally, the solid state image sensor may be a back surface irradiation type or a front surface irradiation type.

Note that the present technology is not limited to the application to the solid state image sensor, and can be applied to an imaging device. The imaging device as used herein is a camera system such as a digital still camera and a digital video camera, or an electronic apparatus having an imaging function such as a mobile phone. Note that a modular form mounted on the electronic apparatus, that is, a camera module, may serve as the imaging device.

3. Third Embodiment

<Configuration Example of Electronic Apparatus>

Hereinafter, a configuration example of an electronic apparatus of the second embodiment of the present technology will be described with reference to FIG. 16.

The electronic apparatus 400 illustrated in FIG. 16 includes a solid state image sensor (element chip) 401, an optical lens 402, a shutter device 403, a drive circuit 404, and a signal processing circuit 405. As the solid state image sensor 401, the solid state image sensor on which the ramp generation circuit of the first embodiment of the above-mentioned present technology has been mounted is provided. Consequently, the gain transition can be performed at high speed.

The optical lens 402 forms, on an imaging surface of the solid state image sensor 401, an image of image light (incident light) from an object. Consequently, signal charges are accumulated in the solid state image sensor 401 for a certain period. The shutter device 403 controls a light irradiation period and a light shielding period for the solid state image sensor 401.

The drive circuit 404 supplies a drive signal that controls signal transfer operation of the solid state image sensor 401 and shutter operation of the shutter device 403. The drive signal (timing signal) supplied from the drive circuit 404 causes the solid state image sensor 401 to perform the signal transfer. The signal processing circuit 405 performs various signal processes on a signal output from the solid state image sensor 401. A video signal subjected to the signal process is stored in a storage medium such as a memory or output to a monitor.

Note that the embodiments in the present disclosure are not limited to the above-mentioned embodiments, and can be variously changed in a range not departing from the gist of the present disclosure.

In addition, the configuration described above as a single device (or processing unit) may be divided and configured as a plurality of devices (or processing units). To the contrary, the configuration described above as a plurality of devices (or processing units) may be combined and configured as a single device (or processing unit). Needless to say, a configuration other than the above-mentioned configuration may be added to the configuration of each device (or each processing unit). Furthermore, as long as the configuration and the operation of the system as a whole are substantially the same, a part of the configuration of a certain device (or processing unit) may be included in the configuration of another device (or another processing unit). In other words, the present technology is not limited to the above-mentioned embodiments, and can be variously changed in a range not departing from the gist of the present technology.

The preferable embodiments of the present disclosure have been described so far in detail with reference to the accompanying drawings. However, the disclosure is not limited to these examples. It is obvious that various types of variations or modifications can be conceived in a range of the technical idea described in the claims when a person has ordinary knowledge of the technical filed to which the present disclosure belongs. It is naturally understood that these variations or modifications also belong to the technical range of the present disclosure.

Note that the present technology can also be configured as follows.

(1) A solid state image sensor including:
a ramp generation digital-to-analog converter (DAC) configured to generate a ramp wave, the number of ramp generation DACs corresponding to different kinds of gains; and
a sample hold circuit configured to individually hold each of gain DAC output voltages corresponding to the different kinds of gains from a gain control DAC that controls an output gain of the ramp wave, the number of sample hold circuits corresponding to the different kinds of gains.

(2) The solid state image sensor according to (1), further including
the one gain control DAC.

(3) The solid state image sensor according to (1) or (2), wherein
the ramp generation DAC is switched by an input ramp selection signal.

(4) The solid state image sensor according to any of (1) to (3), further including
a DAC having a different function than the ramp generation DAC and the gain control DAC.

(5) The solid state image sensor according to (4), wherein
the DAC having the different function is a clamp DAC that adds an offset to the ramp wave.

(6) An electronic apparatus including:
a solid state image sensor including:
a ramp generation digital-to-analog converter (DAC) configured to generate a ramp wave, the number of ramp generation DACs corresponding to different kinds of gains; and
a sample hold circuit configured to individually hold each of gain DAC output voltages corresponding to the different kinds of gains from a gain control DAC that controls an output gain of the ramp wave, the number of sample hold circuits corresponding to the different kinds of gains;
a signal processing circuit configured to process an output signal output from the solid state image sensor; and
an optical system configured to cause incident light to enter the solid state image sensor.

(7) The electronic apparatus according to (6), wherein
the solid state image sensor further includes the one gain control DAC.

(8) The electronic apparatus according to (6) or (7), wherein
the ramp generation DAC is switched by an input ramp selection signal.

(9) The electronic apparatus according to any of (6) to (8), wherein
the solid state image sensor further includes a DAC having a different function than the ramp generation DAC and the gain control DAC.

(10) The electronic apparatus according to (9), wherein
the DAC having the different function is a clamp DAC that adds an offset to the ramp wave.

REFERENCE SIGNS LIST

1 Solid state image sensor
2 Pixel

3 Pixel region
31 A/D conversion circuit
41 Ramp generation circuit
42 Comparator
43 Counter
71 DDR counter
72-1 to 72-5 Current source
81 Gain control DAC
82 Counter
83 Ramp generation DAC
111 Inverter
112-1, 112-2 Buffer
113-1, 113-2 Buffer
114-1, 114-2 Counter
115-1, 115-2 Sample hold circuit
116-1, 116-2 Ramp generation DAC
117 Output switch
201 Clamp DAC
400 Electronic apparatus
401 Solid state imaging device
402 Optical lens
403 Shutter device
404 Drive circuit
405 Signal processing circuit

What is claimed is:

1. A solid state image sensor comprising:
a plurality of ramp generation digital-to-analog converter (DACs) configured to generate a ramp wave, wherein different ramp generation DACs in the plurality of ramp generation DACs output different kinds of gains; and
a plurality of sample hold circuits configured to individually hold gain DAC output voltages corresponding to the different kinds of gains from a gain control DAC that controls an output gain of the ramp wave, wherein a number of sample hold circuits in the plurality of sample hold circuits corresponds to a number of the different kinds of gains.

2. The solid state image sensor according to claim 1, wherein the gain control DAC provides different gain control codes to different sample hold circuits in the plurality of sample hold circuits.

3. The solid state image sensor according to claim 1, wherein the ramp generation DAC is switched by an input ramp selection signal.

4. The solid state image sensor according to claim 1, further comprising a clamp DAC.

5. The solid state image sensor according to claim 4, wherein the clamp DAC adds an offset to the ramp wave.

6. An electronic apparatus comprising:
a solid state image sensor including:
a plurality of ramp generation digital-to-analog converters (DACs) configured to generate a ramp wave, wherein different ramp generation DACs in the plurality of ramp generation DACs output different kinds of gains; and
a plurality of sample hold circuits configured to individually hold gain DAC output voltages corresponding to the different kinds of gains from a gain control DAC that controls an output gain of the ramp wave, the number of sample hold circuits in the plurality of sample hold circuits corresponds to a number of the different kinds of gains;
a signal processing circuit configured to process an output signal output from the solid state image sensor; and
an optical system configured to cause incident light to enter the solid state image sensor.

7. The electronic apparatus according to claim 6, wherein the gain control DAC is included in the solid state image sensor.

8. The electronic apparatus according to claim 6, wherein the ramp generation DAC is switched by an input ramp selection signal.

9. The electronic apparatus according to claim 6, wherein the solid state image sensor further comprises a clamp DAC.

10. The electronic apparatus according to claim 9, wherein the clamp DAC adds an offset to the ramp wave.

* * * * *